US012764878B2

(12) United States Patent
Shim

(10) Patent No.: US 12,764,878 B2
(45) Date of Patent: Oct. 13, 2026

(54) ROLLABLE DIGITAL BLIND AND CONTROL METHOD THEREOF

(71) Applicant: LG ELECTRONICS INC., Seoul (KR)

(72) Inventor: Minhee Shim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 364 days.

(21) Appl. No.: 18/716,844

(22) PCT Filed: Jan. 3, 2022

(86) PCT No.: PCT/KR2022/000017

§ 371 (c)(1),
(2) Date: Nov. 29, 2024

(87) PCT Pub. No.: WO2023/128038

PCT Pub. Date: Jul. 6, 2023

(65) Prior Publication Data

US 2025/0089187 A1 Mar. 13, 2025

(51) Int. Cl.

*H05K 5/02* (2006.01)
*E06B 9/70* (2006.01)

(Continued)

(52) U.S. Cl.

CPC ............. *H05K 5/0217* (2013.01); *E06B 9/70* (2013.01); *H05K 5/30* (2025.01); *H02J 7/35* (2013.01); *H02S 30/20* (2014.12)

(58) Field of Classification Search

CPC H05K 5/0217; H05K 5/30; E06B 9/70; H02J 7/35; H02S 30/20; G09F 9/30; G09F 9/301; H10K 77/111; G06F 1/1652

See application file for complete search history.

(56) References Cited

U.S. PATENT DOCUMENTS 11,078,725 B2 * 8/2021 Geiger ...................... E06B 9/40
12,234,685 B2 * 2/2025 Greco ....................... E06B 9/17

(Continued)

FOREIGN PATENT DOCUMENTS

KR 10-0973716 B1 8/2010
KR 10-2010-0104037 A 9/2010

(Continued)

*Primary Examiner* — Sagar Shrestha

(74) *Attorney, Agent, or Firm* — Birch, Stewart, Kolasch & Birch, LLP

(57) ABSTRACT

A rollable digital blind comprises: a screen including a flexible display panel which displays an image and comprises a flexible material, and a flexible solar panel which is overlappingly disposed at one surface of the flexible display panel; a cylindrical-shaped roller which is rotated to wind the screen thereon or unwind the screen therefrom; a housing in which the roller is accommodated; a battery which is charged through the flexible solar panel; a drive unit which is supplied with power from the battery to rotate the roller; a composite photosensor which senses sunlight; and a control unit which, if the composite photosensor senses sunlight, controls the drive unit to unwind the screen and charge the battery through the solar panel. The rollable digital blind not only serves as a blind, but can also be used as a display for outputting an image.

14 Claims, 6 Drawing Sheets

(51) Int. Cl.

| | |
|---|---|
| ***H05K 5/30*** | (2025.01) |
| *H02J 7/35* | (2006.01) |
| *H02S 30/20* | (2014.01) |

(56) References Cited

U.S. PATENT DOCUMENTS

| | | | | |
|---|---|---|---|---|
| 2005/0040962 | A1* | 2/2005 | Funkhouser | G06F 1/1601 340/815.4 |
| 2008/0303782 | A1* | 12/2008 | Grant | G06F 3/016 345/173 |
| 2012/0050975 | A1* | 3/2012 | Garelli | G06F 1/181 361/679.01 |
| 2013/0284234 | A1* | 10/2013 | Funayama | E04F 10/06 136/251 |
| 2014/0224434 | A1* | 8/2014 | Gross | E06B 9/42 160/405 |
| 2015/0220119 | A1* | 8/2015 | Seo | G09G 5/37 345/173 |
| 2017/0235341 | A1* | 8/2017 | Huitema | G04G 17/08 361/679.03 |
| 2017/0342771 | A1* | 11/2017 | Piekny | B60J 1/2019 |
| 2018/0030781 | A1* | 2/2018 | Hall | H02S 30/10 |
| 2019/0309559 | A1* | 10/2019 | Hall | F24F 11/74 |
| 2023/0019165 | A1* | 1/2023 | Baudo | E04F 10/06 |

FOREIGN PATENT DOCUMENTS

| | | | |
|---|---|---|---|
| KR | 10-2011-0014326 | A | 2/2011 |
| KR | 10-2013-0115699 | A | 10/2013 |
| KR | 10-2014-0074458 | A | 6/2014 |
| KR | 10-2015-0081572 | A | 7/2015 |
| KR | 10-2017-0066838 | A | 6/2017 |
| KR | 10-2020-0005757 | A | 1/2020 |
| KR | 10-2171882 | B1 | 10/2020 |
| KR | 10-2305728 | B1 | 9/2021 |
| KR | 10-2021-0128042 | A | 10/2021 |

* cited by examiner

FIG. 2

| Reference for ambient luminance | Lux |
|---|---|
| Sunrise, Sunset on a cloudy day | 40~ |
| Movie Theatre with emergency lights | 50~80 |
| Cloudy, Evening | 100~200 |
| Typical office theatrette | 120~150 |
| Ballroom | 150~200 |
| Training room dimmed | 200~250 |
| Office | 320~ |
| Training room full light | 350~450 |
| sunrise, sunset in a clear day | 400~ |
| Task Area (Fitting room) | 500~ |
| Cloudy, Midday | 1,000~2,000 |
| Clear blue sky, midday under shade | 20,000~ |

FIG. 3

| TEMPERATURE (K) | HUE | MODE | KELVIN DEGREES | FILMING ENVIRONMENT |
|---|---|---|---|---|
| | | | 20,000~27,000 | BLUE SKY REFLECTED IN WATER |
| 10,000 | | | 10,000~20,000 | HIGH SKY LIGHT ON CLEAR DAY |
| 9,000 | | | 9,500~25,000 | SKY LIGHT ON SUNLESS SUMMER DAY |
| 8,000 | | | 8,000 | SHADE ON SUNNY DAY |
| | | | 7,500~8,400 | CLOUDY OR FOGGY DAY |
| 7,000 | | | 9,500~25,000 | SHADE ON CLOUDY DAY |
| 6,000 | | | 9,500~25,000 | CLOUDY DAY |
| | | | 9,500~25,000 | SUMMER MIDDAY |
| | | | 9,500~25,000 | SUNLIGHT |
| 5,500 | | | 9,500~25,000 | NORMAL NOON |
| | | | 9,500~25,000 | BLUE SKY SUMMER DAY |
| | | | 9,500~25,000 | FLASH |
| 5,000 | | | 9,500~25,000 | DAYLIGHT |
| | | | 9,500~25,000 | PHOTO FLOOD LIGHT SOURCE FOR DAYLIGHT |
| 4,500 | | | 9,500~25,000 | SUNLESS DAYLIGHT |
| | | | 9,500~25,000 | FLUORESCENT LAMP FOR DAYLIGHT |
| 4,000 | | | 9,500~25,000 | EARLY MORNING AND LATE AFTERNOON SUNLIGHT |
| | | | 9,500~25,000 | SUNLIGHT BETWEEN 10AM AND 3AM |
| | | | 9,500~25,000 | FLUORESCENT LAMP |
| 3,500 | | | 9,500~25,000 | AFTER SUNRISE OR BEFORE SUNSET |
| | | | 9,500~25,000 | TUNGSTEN HALOGEN LAMP |
| | | | 9,500~25,000 | PHOTO LAMP |
| | | | 9,500~25,000 | STUDIO TUNGSTEN LAMP |
| | | | 9,500~25,000 | PHOTO LAMP |
| 3,000 | | | 9,500~25,000 | TUNGSTEN LAMP |
| | | | 9,500~25,000 | 500W INCANDESCENT LIGHT BULB |
| | | | 9,500~25,000 | 100W~200W INCANDESCENT LIGHT BULB |
| | | | 9,500~25,000 | 40W~60W INCANDESCENT LIGHT BULB |
| | | | 9,500~25,000 | TUNGSTEN LAMP FOR HOME |
| 2,000 | | | 9,500~25,000 | AT SUNRISE AND SUNSET: |
| | | | 9,500~25,000 | MATCH LIGHT |
| | | | 9,500~25,000 | INCANDESCENT LIGHT BULB |
| | | | 9,500~25,000 | CANDLELIGHT |

FIG. 4
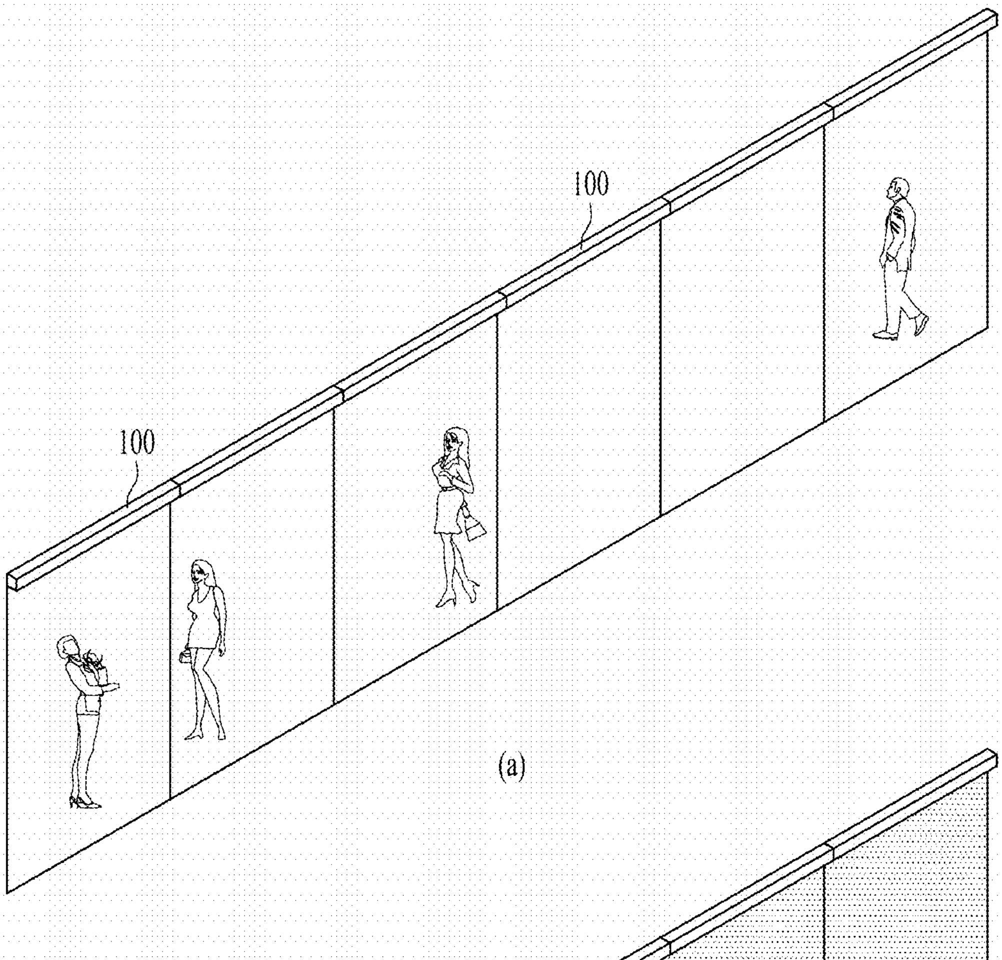
(a)
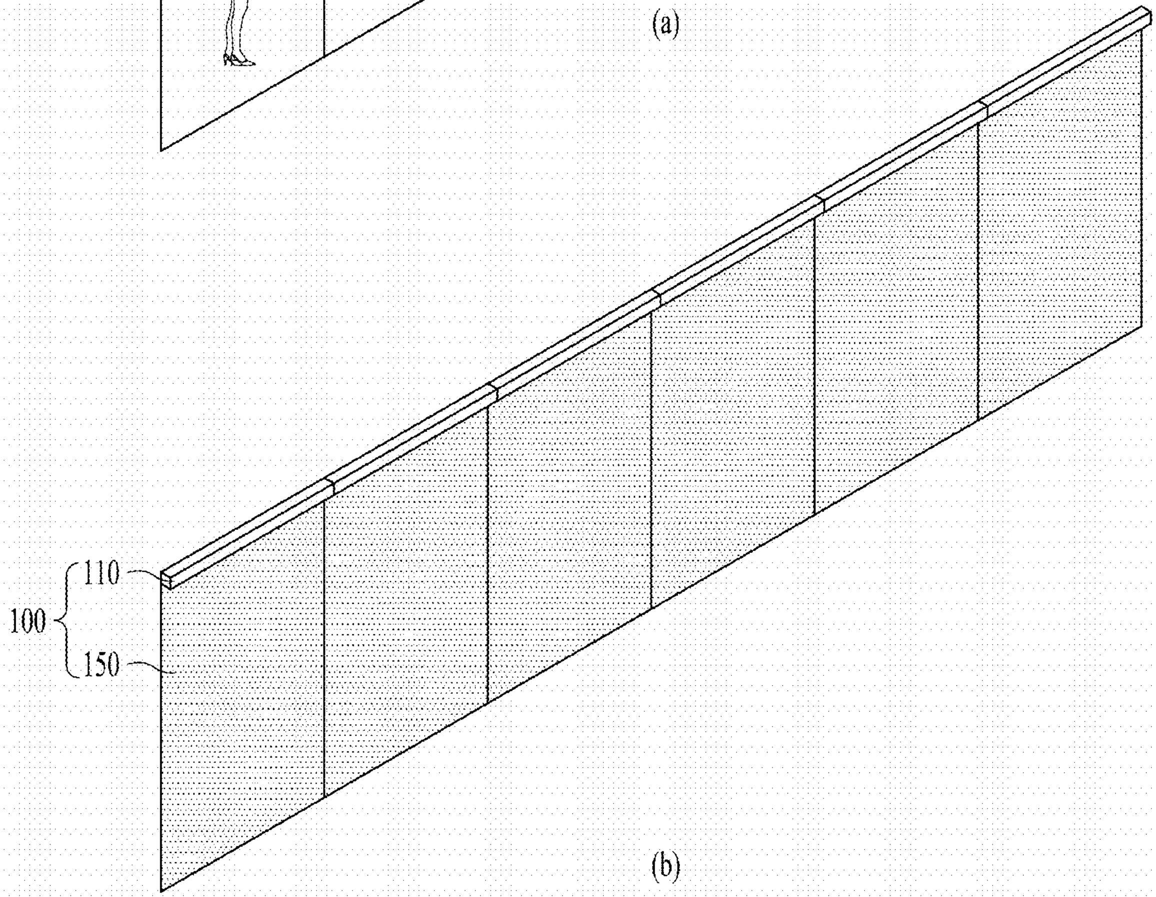
(b)

ROLLABLE DIGITAL BLIND AND CONTROL METHOD THEREOF

CROSS REFERENCE TO RELATED APPLICATIONS

This application is the National Phase of International Application No. PCT/KR2022/000017 filed on Jan. 3, 2022, which is hereby expressly incorporated by reference into the present application.

TECHNICAL FIELD

The present disclosure relates to a rollable digital blind that may have a light blocking effect and may output an image via self-generation.

BACKGROUND

There are various types of display modules that implement an image. For example, there are various display modules such as a liquid crystal display (LCD) panel, a light emitting diode (LED) display panel, a plasma display panel (PDP), an organic light emitting diode (OLED) display panel, and the like.

Additionally, a film-type display module that implements the image is known. In particular, because of popularization of the OLED, which is a transparent and flexible film-type display panel, a lighter and thinner display device may be implemented, and the display may be installed in various places by adjusting transparency thereof.

In particular, recently, a display device that outputs the image by being attached to glass such as a window using a transparent and flexible display module has been used for outdoor advertising.

However, unlike a general display device that may be used immediately after being mounted, such installation-type display device has difficulties in, for example, wiring and thus has to be installed by an installer on site, so that such installation-type display device is difficult to be spread.

SUMMARY

Technical Problem

The present disclosure is to provide a rollable digital blind that may have a light blocking effect and may output an image and be operated via self-generation, and thus, may be installed easily, and a method for controlling the same.

Technical Solutions

According to an aspect of the present disclosure, provided is a rollable digital blind including a screen including a flexible display panel that displays an image and includes a flexible material, and a flexible solar panel disposed on one surface of the flexible display panel in an overlapping manner, a cylindrical roller that rotates to wind or unwind the screen, a housing where the roller is accommodated, a battery charged via the flexible solar panel, a driver that receives power from the battery and rotates the roller, a complex optical sensor that senses sunlight, and a controller that controls the driver to unfold the screen and charges the battery via the solar panel when sunlight is sensed by the complex optical sensor.

The complex optical sensor may include a color sensor that senses a color temperature and an infrared sensor that senses an amount of infrared light, and the controller may control the driver to unfold the screen by determining that sunlight has been sensed when the color temperature and the amount of infrared light are equal to or greater than reference values, respectively.

The complex optical sensor may be mounted in the housing to face outside when installed on a window.

The controller may control the driver to unfold the screen and output the image via the flexible display panel when an image output command is input.

The flexible solar panel may be transparent, and the flexible display panel may output the image toward one surface of the screen.

The flexible solar panel may be transparent, and the flexible display panel may be able to adjust transparency thereof.

The controller may control the driver to unfold the screen and switch a state of the flexible display panel to an opaque state when a command to unfold the screen is input when the complex optical sensor has not sensed sunlight.

The rollable digital blind may further include a bottom bar located at a lower end of the screen and transparent.

The rollable digital blind may further include a blind rail installed on a window frame of a window where the rollable digital blind is installed, wherein both ends of the bottom bar are fastened to the blind rail, and the bottom bar may move along the blind rail.

The solar panel may include at least one of a crystalline silicon-based solar panel, an amorphous silicon (a-Si)-based solar panel, a copper indium selenium (CIS)-based solar panel, a copper indium gallium selenium (CIGS)-based solar panel, a cadmium telluride (CdTe)-based solar panel, and a dye-sensitized solar panel.

According to another aspect of the present disclosure, provided is a method for controlling a rollable digital blind including a screen including a flexible display panel and a flexible solar panel, including recognizing, by a complex optical sensor, sunlight, rotating a roller with the screen wound thereon to unfold the screen and charge a battery when recognizing sunlight, and unfolding the screen when there is a command to unfold the screen when sunlight has not been sensed.

The complex optical sensor may include a color sensor that senses a color temperature and an infrared sensor that senses an amount of infrared light, and the recognizing, by the complex optical sensor, of sunlight may include determining that sunlight has been sensed when the color temperature and the amount of infrared light are equal to or greater than reference values, respectively.

The method may further include unfolding the screen and outputting, by the flexible display panel, an image when an image output command is input.

The flexible solar panel may be transparent, and the method may further include switching a state of the flexible display panel to an opaque state when a command to unfold the screen is input when sunlight has not been sensed.

Advantageous Effects

According to an embodiment of the present disclosure, the rollable digital blind may serve as the blind, and at the same time, be used as the display that outputs the image.

In addition, the rollable digital blind may be installed by being simply mounted on the existing window and may operate without the power connection via the self-generation, and thus may not be restricted in the installation location.

The flexible display panel may allow the image to be viewed from inside and outside by selectively adjusting the transparency thereof.

Effects obtainable from the present disclosure are not limited by the above mentioned effects, and other unmentioned effects can be clearly understood from the above description by those having ordinary skill in the technical field to which the present disclosure pertains.

BRIEF DESCRIPTION OF THE DRAWINGS

FIG. 2 is a table showing environments with similar illuminance.

FIG. 3 is a table showing environments based on a color temperature.

FIG. 4 is a diagram illustrating operation of a screen of a rollable digital blind according to an embodiment of the present disclosure.

BEST MODE

Description will now be given in detail according to exemplary embodiments disclosed herein, with reference to the accompanying drawings. For the sake of brief description with reference to the drawings, the same or equivalent components may be provided with the same reference numbers, and description thereof will not be repeated.

In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
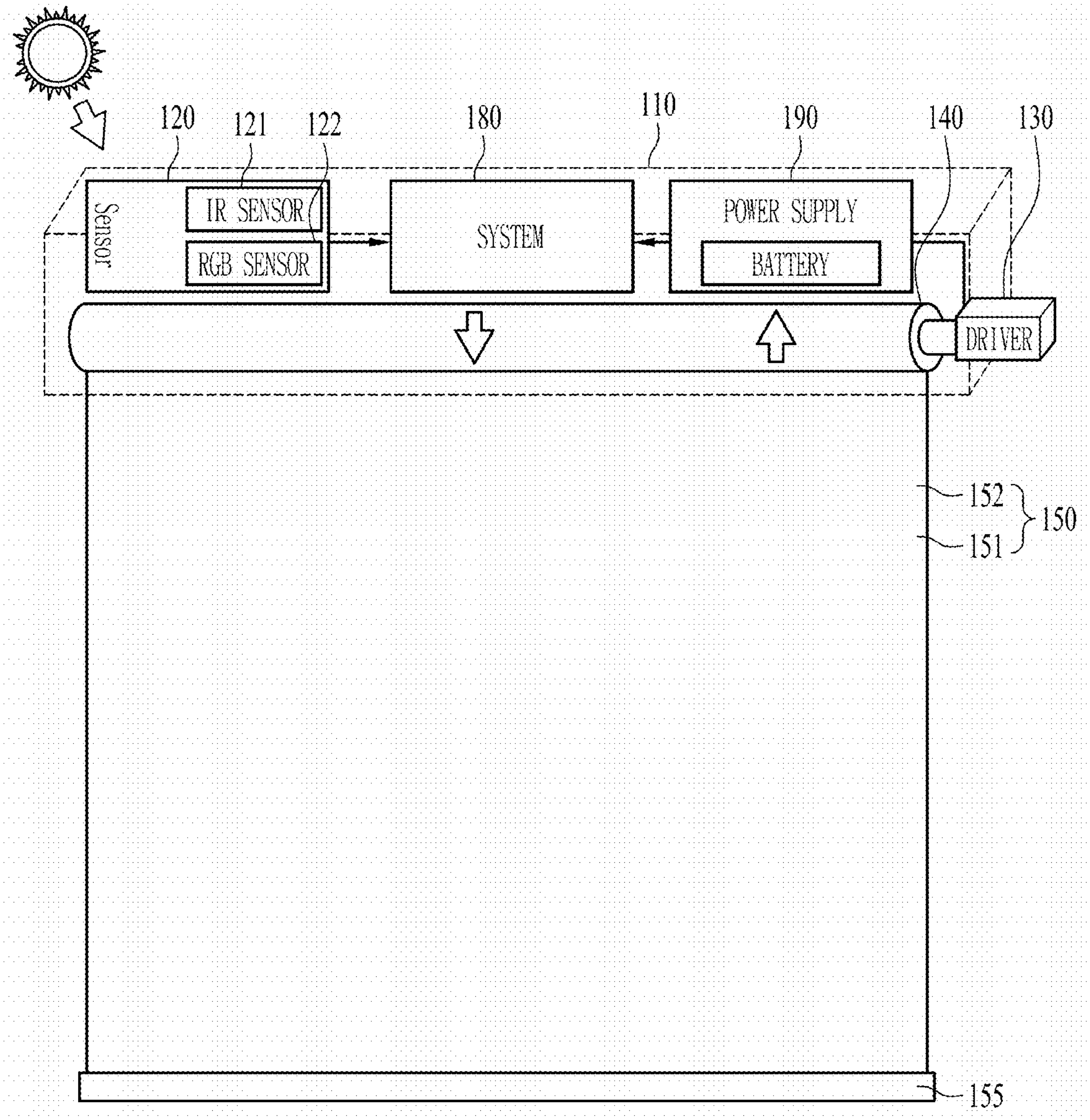
FIG. 1 is a diagram showing a configuration of a rollable digital blind according to an embodiment of the present disclosure.

FIG. 1 is a diagram showing a configuration of a rollable digital blind 100 according to an embodiment of the present disclosure. The rollable digital blind 100 according to the present disclosure includes a screen 150 in which a flexible display panel 151 and a flexible solar panel 152 are disposed to overlap each other.

The screen 150 may be wound around a roller 140 and accommodated inside a housing 110, and may be unwound and extended out of the housing 110 as shown in FIG. 1 as the roller 140 rotates.

The rollable digital blind 100 may be installed on a window as shown in FIG. 2 and may cover or expose the window. Both the flexible display panel 151 and the flexible solar panel 152 may have a bendable structure and may be wound around the roller.

A representative example of the flexible display panel 151 is an organic light emitting display (OLED) panel. Unlike a liquid crystal display panel, the organic light emitting display panel may not require a backlight and may emit light from an element itself.

A thickness of the flexible display panel 151 may become thinner, and the flexible display panel 151 may be formed on a special glass or a plastic film to implement a flexible display. Additionally, a transparent display panel 151 may be implemented using transparent materials for both anode and cathode panels. Transparency may be adjusted by controlling an image output on the transparent display panel 151, and the image may be viewed at both sides.

The flexible solar panel 152 stacked together with the flexible display panel 151 is flexible and thus is bendable together with the flexible display panel 151.

The flexible solar panel 152 may include at least one of crystalline silicon-based, amorphous silicon (a-Si)-based, copper indium selenium (CIS)-based, copper indium gallium selenium (CIGS)-based, cadmium telluride (CdTe)-based, and dye-sensitized solar panels 152.

The flexible solar panel 152 according to the present disclosure may transmit light. Because the solar panel 152 converts sunlight into electrical energy, the typical solar panel 152 may be opaque, but a solar panel 152, which uses wavelengths of light other than visible light, may be implemented transparently.

Alternatively, using a micro-lattice structure including micro-holes defined therein, a portion of the typical solar panel 152 may transmit light and another portion thereof may absorb light and convert the light into the electrical energy.

When the solar panel 152 is stacked together with the flexible display panel 151, the image output from the flexible display panel 151 may be transmitted through the solar panel 152, and at the same time, a battery of a power supply may be charged via the solar panel 152.

With the screen 150 unfolded, the flexible solar panel 152 may be located to face the outside of the window to receive sunlight, and the flexible display panel 151 may be located to face the inside of a building.

Using power of the battery charged via the flexible solar panel 152, the power supply may supply the power to a driver 130 that rotates the roller 140 and supply power to operate the flexible display panel 151.

The rollable digital screen 150 is able to receive the power via a system, and the system operates the flexible display panel 151 only when a command to operate the flexible display panel 151, that is, an image output command, is input.

A sensor may include a complex optical sensor 120 that may recognize sunlight and may include a wireless input unit that recognizes a wireless signal from a remote control device. The complex optical sensor 120, as an optical sensor that may recognize sunlight, may include an infrared sensor 121 and a color sensor 122 because accuracy is low when recognizing sunlight simply via illuminance.

FIG. 2 is a table showing environments with similar illuminance, and FIG. 3 is a table showing environments based on a color temperature.

As shown in FIG. 2, there is a great difference in the illuminance of sunlight depending on the weather (a cloudy day, a clear day, and a rainy day) and time (morning, daytime, and evening). Additionally, the solar panel 152 may be unable to produce electricity because there may be cases in which light is from a light source other than the sun within an illuminance range similar to that of sunlight. In addition, solar power may be generated even when the illuminance is low on the cloudy day, so that it is difficult to determine presence or absence of sunlight simply by a level of the illuminance.

Therefore, the presence or the absence of sunlight may be determined by sensing an amount of infrared light using the infrared sensor 121. Unlike light from indoor lighting, sunlight contains infrared light, so that the presence or the absence of sunlight may be sensed via the infrared sensor 121.

Additionally, using the color sensor 122, whether it is the clear day or the cloudy day and whether it is sunset or sunrise time or midday may be determined.

FIG. 3 is the table showing the color temperature, which may indicate different color temperatures depending on whether light is sunlight and depending on a type of light source. In particular, sunlight usually has a high color temperature and artificial lighting has a low color temperature, so that when the high color temperature is indicated, light may be determined to be sunlight.

Therefore, it may be determined that there is sunlight suitable for the solar panel 152 to operate by sensing the amount of infrared light with the infrared sensor 121 of the complex optical sensor 120 and sensing the color temperature with the color sensor 122, and combining the two factors with each other.

The complex optical sensor 120 may be installed in the housing 110 so as to face the outside when the rollable digital blind 100 is installed on the window, and may be located to face the same direction as the flexible solar panel 152 faces.

The driver 130 may rotate the roller 140 based on control of the system, and the screen 150 may be accommodated into or extended from the housing 110 and cover the window depending on a direction of rotation. The housing 110 in which the roller 140 is accommodated may be installed at an upper side of the window and may have a cylindrical shape or a box shape long in one direction.

Because the screen 150 is wound and unwound around the roller 140, the screen 150 may maintain the bent state even when being unwound from the roller 140. In this case, an electrical energy production efficiency of the flexible solar panel 152 is reduced and the image output from the flexible display panel 151 is distorted.

A bottom bar 155 with a predetermined weight is attached to a lower end of the screen 150, and when the screen 150 is unwound, the screen 150 is pulled downward so as to be unfolded in a flat form. The bottom bar 155 may be made of a transparent material so as not to be visible even when the flexible display panel 151 is transparent.

For the screen 150 to be unfolded more stably in the flat state, a vertically extending rail of the blind 100 may be installed on a window frame, and an end of the bottom bar 155 may be inserted into the rail of the blind 100. Because the bottom bar 155 moves along the rail of the blind 100, the screen 150 may maintain the flat state.

Figure 5:
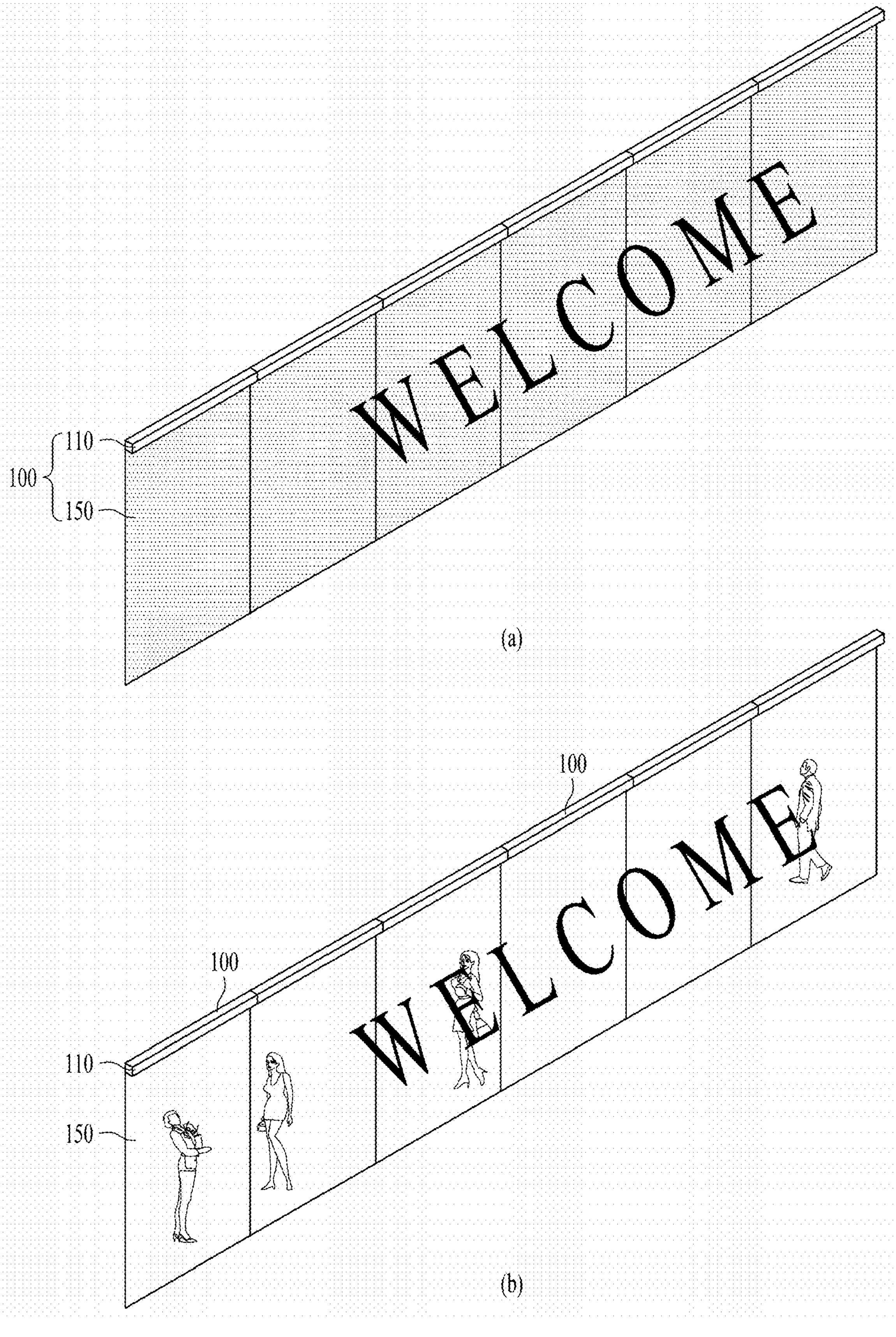
FIG. 5 is a diagram showing control of a flexible display panel of a screen of a rollable digital blind according to an embodiment of the present disclosure.

FIG. 4 is a diagram illustrating operation of the screen 150 of the rollable digital blind 100 according to an embodiment of the present disclosure, and FIG. 5 is a diagram showing control of the flexible display panel 151 of the screen 150 of the rollable digital blind 100 according to an embodiment of the present disclosure.

Referring to (a) in FIG. 4, the state in which the rollable display blind 100 is installed at the upper side of the window, and the window is open with the screen 150 accommodated inside the housing 110.

In (b) in FIG. 4, the screen 150 may be extended from the housing 110 and cover the window; and during the day, may use sunlight to charge the power supply and block light from entering the building to serve as the blind 100.

When using the transparent solar panel 152, a light blocking effect is reduced, so that a light blocking function as the blind 100 may be improved by operating the flexible display panel 151 to lower transmittance.

In this regard, the image may be output on the flexible display panel 151 in the opaque state, as shown in (a) in FIG. 5. Alternatively, the image may be viewed from both inside and outside by outputting the image in the transparent state, as shown in (b) in FIG. 5.

The screens 150 of various combinations may be implemented using the transparent flexible solar panel 152 and the transparent flexible display panel 151.

Figure 6:
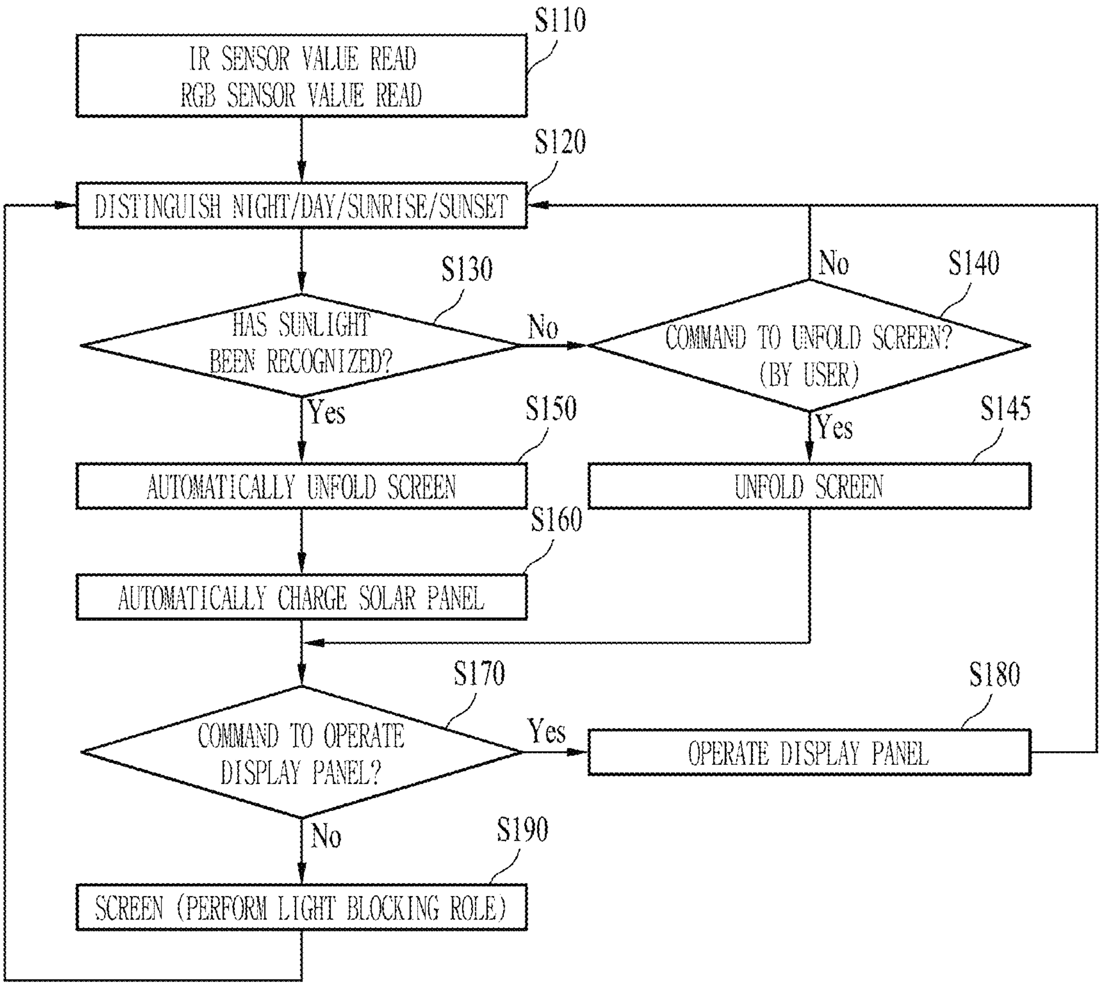
FIG. 6 is a flowchart showing a method for controlling a rollable digital blind according to an embodiment of the present disclosure.

FIG. 6 is a flowchart showing a method for controlling the rollable digital blind 100 according to an embodiment of the present disclosure.

First, an infrared (IR) sensor value and a color (RGB) sensor value of the complex optical sensor 120 are read (S100). Based on such values, night/day/sunrise/sunset may be distinguished from each other, and whether sunlight has been recognized may be determined (S120 and S130).

When sunlight is recognized as sunlight having intensity sufficient for a flexible solar cell to operate (S130), the screen 150 may be automatically unfolded to charge the solar panel 152 (S150 and S160). When sunlight is insufficient, only when there is a command to unfold the screen 150 (S140), the screen 150 is unfolded (S145), and when there is no command to unfold the screen 150, the screen 150 remains accommodated in the housing 110.

When there is the command to operate the display panel 151 while the screen 150 is in the unfolded state (S170), the display panel 151 may be operated to output the image (S180). When there is no operating command, the state of the display panel 151 may be switched to the opaque state to perform the light blocking function of the screen 150 (S190).

According to an embodiment of the present disclosure, the rollable digital blind 100 may serve as the blind 100, and at the same time, be used as the display that outputs the image.

In addition, the rollable digital blind 100 may be installed by being simply mounted on the existing window and may operate without power connection using self-generation, and thus may not be restricted in an installation location.

The flexible display panel 151 may allow the image to be viewed from inside and outside by selectively adjusting the transparency thereof.

The above detailed description should not be construed as being limitative in all terms, but should be considered as being illustrative. The scope of the present invention should be determined by reasonable analysis of the accompanying claims, and all changes in the equivalent range of the present invention are included in the scope of the present invention.

What is claimed is:

1. A rollable digital blind comprising:

a screen including a flexible display panel configured to display an image and including a flexible material, and a flexible solar panel disposed on one surface of the flexible display panel in an overlapping manner;

a cylindrical roller configured to rotate to wind or unwind the screen;

a housing where the roller is accommodated;

a battery charged via the flexible solar panel;

a driver configured to receive power from the battery and rotate the roller;

a complex optical sensor configured to sense sunlight; and a controller configured to control the driver to unfold the screen and charge the battery via the solar panel when sunlight is sensed by the complex optical sensor.

2. The rollable digital blind of claim 1, wherein the complex optical sensor includes a color sensor configured to sense a color temperature and an infrared sensor configured to sense an amount of infrared light, wherein the controller is configured to control the driver to unfold the screen by determining that sunlight has been sensed when the color temperature and the amount of infrared light are equal to or greater than reference values, respectively.

3. The rollable digital blind of claim 1, wherein the complex optical sensor is mounted in the housing to face outside when installed on a window.

4. The rollable digital blind of claim 1, wherein the controller is configured to control the driver to unfold the screen and output the image via the flexible display panel when an image output command is input.

5. The rollable digital blind of claim 1, wherein the flexible solar panel is transparent, wherein the flexible display panel outputs the image toward one surface of the screen.

6. The rollable digital blind of claim 1, wherein the flexible solar panel is transparent, wherein the flexible display panel is able to adjust transparency thereof.

7. The rollable digital blind of claim 6, wherein the controller is configured to control the driver to unfold the screen and switch a state of the flexible display panel to an opaque state when a command to unfold the screen is input when the complex optical sensor has not sensed sunlight.

8. The rollable digital blind of claim 1, further comprising a bottom bar located at a lower end of the screen and transparent.

9. The rollable digital blind of claim 8, further comprising a blind rail installed on a window frame of a window where the rollable digital blind is installed, wherein both ends of the bottom bar are fastened to the blind rail, wherein the bottom bar moves along the blind rail.

10. The rollable digital blind of claim 1, wherein the solar panel includes at least one of a crystalline silicon-based solar panel, an amorphous silicon (a-Si)-based solar panel, a copper indium selenium (CIS)-based solar panel, a copper indium gallium selenium (CIGS)-based solar panel, a cadmium telluride (CdTe)-based solar panel, and a dye-sensitized solar panel.

11. A method for controlling a rollable digital blind including a screen including a flexible display panel and a flexible solar panel, the method comprising:

recognizing, by a complex optical sensor, sunlight;

rotating a roller with the screen wound thereon to unfold the screen and charge a battery when recognizing sunlight; and unfolding the screen when there is a command to unfold the screen when sunlight has not been sensed.

12. The method of claim 11, wherein the complex optical sensor includes a color sensor configured to sense a color temperature and an infrared sensor configured to sense an amount of infrared light, wherein the recognizing, by the complex optical sensor, of sunlight includes determining that sunlight has been sensed when the color temperature and the amount of infrared light are equal to or greater than reference values, respectively.

13. The method of claim 11, further comprising unfolding the screen and outputting, by the flexible display panel, an image when an image output command is input.

14. The method of claim 11, wherein the flexible solar panel is transparent, wherein the method further includes switching a state of the flexible display panel to an opaque state when a command to unfold the screen is input when sunlight has not been sensed.

* * * * *